United States Patent
Chi et al.

(10) Patent No.: US 7,355,396 B1
(45) Date of Patent: Apr. 8, 2008

(54) APPARATUS FOR CONTROLLING AND ADJUSTING THE MAGNETIC STATE OF A MAGNETIC PROBE AND THE APPLICATIONS THEREOF

(75) Inventors: Cheng-Chung Chi, Hsinchu (TW); Yang-Chung Liao, Hsinchu (TW); Ming-Jye Wang, Taipei (TW)

(73) Assignee: National Tisng Hau University, Hsinchu (TW)

( * ) Notice: Subject to any disclaimer, the term of this patent is extended or adjusted under 35 U.S.C. 154(b) by 0 days.

(21) Appl. No.: 11/621,260

(22) Filed: Jan. 9, 2007

(51) Int. Cl.
*G01R 33/035* (2006.01)
*G01R 33/12* (2006.01)

(52) U.S. Cl. .............. 324/248; 505/846; 324/244; 324/261

(58) Field of Classification Search .......... 324/248, 324/244, 260–261; 505/845–846, 162; 327/527–528; 600/409
See application file for complete search history.

(56) References Cited

U.S. PATENT DOCUMENTS

| | | | |
|---|---|---|---|
| 5,331,491 A * | 7/1994 | Hayakawa et al. ........ | 360/110 |
| 6,657,431 B2 * | 12/2003 | Xiao ......................... | 324/244 |
| 6,696,833 B2 * | 2/2004 | Hong et al. ................ | 324/244 |
| 6,717,402 B2 * | 4/2004 | Mukasa et al. ............ | 324/252 |

* cited by examiner

*Primary Examiner*—Bot LeDynh
(74) *Attorney, Agent, or Firm*—Lowe Hauptman Ham & Berner, LLP

(57) ABSTRACT

An apparatus for controlling and adjusting the magnetic state of a magnetic probe for detecting magnetic signals of a sample, it employs a negative feedback control unit to counter the change of magnetization of the magnetic probe. The local magnetic field of the sample influences the magnetization of the magnetic probe. Through the feedback coil inductively coupled to the magnetic probe, the variation of magnetization of the magnetic probe is compensated by the magnetization induced by the feedback coil. This apparatus is capable of reducing the magnetic interaction between the magnetic probe and sample. Meanwhile, a current bias unit is used for adjusting the magnetization of the magnetic probe to an arbitrary value. This capability allows a scanning probe microscope applying this invention to manipulate magnetic objects.

16 Claims, 1 Drawing Sheet

APPARATUS FOR CONTROLLING AND ADJUSTING THE MAGNETIC STATE OF A MAGNETIC PROBE AND THE APPLICATIONS THEREOF

BACKGROUND OF THE INVENTION

1. Field of the Invention

The present invention is an invention developed from U.S. patent application Ser. No. 11/434,107, especially relates to an apparatus with the capability of adjusting and controlling the magnetic state of a probe. It uses a negative feedback electronic unit to compensate the change of magnetic moment in the probe by applying a current to the feedback coil inductively coupled with the probe. This coil can also serve as a bias coil to keep the probe at an arbitrary magnetic state. Therefore, this apparatus can control the magnetic interaction between the magnetic probe and the sample.

2. Description of the Prior Art

A scanning probe microscope (SPM) which its probe measures physical quantities and records them a function of position on the sample surface can observe phenomena in the micro world. Detecting magnetic signals in an SPM requires the magnetic interaction between the tip and the sample. The local magnetic field or flux of a sample experienced by the tip can be detected by a specific sensor. For example, the magnetic tip on the cantilever of a magnetic force microscope (MFM) can sense the magnetic state of a sample through either the frequency shift of the vibration or the deflection of the cantilever. In a conventional MFM, a mapping of the magnetic state of sample surface is achieved by the scanning of the tip over the surface. A scanning superconducting quantum interference device (SQUID) microscope (SSM) disclosed in Appl. Phys. Lett. 66, 1138 (1995) by J. R. Kirtley et al. detects a magnetic flux through the pick-up coil coupled to the SQUID that is highly magnetic-sensitive. The employment of a magnetic flux guide in an SSM [Ref. J. R. Kirtley, Physica C 368, 55-65 (2002).] gives rise to the flexibility of an environment placing sample and a SQUID chip. The flux guide, usually made of permalloy, couples the magnetic flux of the sample with the SQUID chip. Through the same methodology of SPM, SSM can measure the delicate magnetic distribution of the sample.

In measuring the magnetic distribution, the magnetic force is exerted on the tip of MFM through the stray field of the sample. Since the magnetization of a material depends on the external magnetic field, the magnetic interaction between the tip and sample may alter either the magnetic state of the sample or the tip during the scan. The current solution to prevent the alteration of the magnetization of the tip is to employ a hard ferromagnetic tip that has a large remanence near the saturation induction. However, it does not solve the problem of the sample; for example, the relative movement between the tip and the sample would drive the domain walls of a soft magnetic film to change when the probe is close enough to the sample. The alteration of sample magnetic distribution can be alleviated by increasing the tip-sample separation, though a degeneration of the spatial resolution is disadvantageous. This dilemma remains to be a tough issue in the field of magnetic force microscopy. The high-permeability tip in a flux-guide SSM can be magnetized by the magnetic field of the sample when the tip approaches the sample. As a picture of magnetic field distribution shows, the tip absorbs the magnetic flux [Ref. T. Kondo and H. Itozaki, Physica C 392-396, 1401-1405 (2003).]. It generates an attractive force between the tip and the local magnetic moment of the sample. In the case of a weak-pined moment, the moving tip can drag the magnetic moment. Again, the magnetic probe disturbs the magnetic distribution of the sample.

U.S. Pat. No. 5,331,491 discloses a magnetic recording head with a soft magnetic needle and an exciting coil wound around the needle. The magnetic needle is a medium that transfers the magnetic signal generated by the exciting coil and conducts the electromagnetic wave emitted by the high-frequency oscillator. To write a signal, it applies an electric current to the exciting coil to magnetize the needle and then records the signal on a magnetic recording medium. The sensing process detects the difference between the wave generated by the oscillator and the wave reflected from the magnetic recording medium, which is influenced by the local magnetic field of the recording medium through the variation of the magnetic permeability of the soft magnetic needle.

U.S. Pat. No. 4,677,512 discloses a magnetic reproducing apparatus including a magnetic guide and two coils, one for writing magnetic signals and the other for the inductor in the tuning circuit for detecting magnetic signals. The magnetic guide induces the magnetization of signals to be recorded on the sample via applying a current in the writing coil wound on the guide. The variation of the magnetic field changes the permeability of the guide where the second coil is disposed in its proximity and thus the inductance of the coil is altered. To detect the magnetic signal in the sample, the frequency shift in the RLC tuning circuit is measured. These two coils function as the component inducing magnetization in the magnetic guide and an inductor in the detecting circuit respectively.

Among the prior arts of magnetic apparatuses, they seldom deal with the problem caused by the magnetic interaction between the probe and the sample. This would be a serious issue in measuring a delicate magnetic signal.

SUMMARY OF THE INVENTION

In accordance with this invention, an apparatus for controlling the magnetic state of a magnetic probe is disclosed; it comprises a magnetic probe, a feedback coil capable of magnetizing the magnetic probe, a magnetic sensitive device, a negative feedback electronic unit, a current source, and a current bias controller. The present invention is to reduce the interference resulting from the magnetic interaction between the magnetic probe and the sample. This apparatus is also capable of the operation in which a magnetic probe with a certain magnetic state is needed. More specifically, this invention is applied to improve the performance of an SPM in the magnetic measurement. Another embodiment of this invention can enable an SPM to manipulate the magnetic object on the sample surface.

To reduce the magnetic interaction between a magnetic probe and the sample, a feedback coil is disposed to inductively couple with the probe. For example, the coil directly wound on the probe is a better coupling condition. The motion of the probe or the variation of the magnetic field of the sample induces a magnetization difference ($\Delta M$). A magnetic sensitive device detects this alteration of the magnetic state in the probe. In the present invention, the magnetic sensitive device is a device sensitive to the magnetic field, magnetic flux, or magnetic force. There are several variations in the magnetic sensitive device, which comprise at least a magnetic sensor such as Hall sensor, giant magnetoresistance (GMR) device, tunnel magnetoresistance (TMR) device, and SQUID. This device inputs the detected magnetic signal into a negative feedback electronic unit. The simplest version of the negative feedback electronic unit is an inverter. To counter the variation of the magnetic state of the probe, a current source applies a current $I_f$ to the feedback coil according to the feedback command from the negative feedback electronic unit. It introduces a magnetization $-M_f$ to the probe. The net magnetization of the probe is then $\Delta M - M_f$ and it can be reduced to a value as small as possible. Through this feedback process, the problem caused by the magnetic interaction between the magnetic probe and the sample is possible to be solved. On the other hand, a current bias controller is employed to adjust the probe to an arbitrary magnetic state. Before turning on the feedback control, the current source applies a current $I_b$ according to the bias command from the current bias controller and thus this probe becomes magnetically adjustable. Besides, applying a diminishing AC current cycle through the current bias controller can eliminate the residual moment of the magnetic probe.

We can apply this invention to an SPM to alleviate the magnetic interaction between the magnetic probe and the sample and to manipulate the magnetic object on the sample surface. In a MFM, the feedback coil can be fabricated on the cantilever right behind the magnetic tip. Another pick-up coil in the same area is needed to monitor the variation of the magnetic state of the tip. Because the employment of this invention can keep the tip at a certain magnetic state, there is no need to use a strong magnet as the tip. It is possible to adjust a high-permeability soft magnetic tip to a proper magnetization, so that the magnetic interaction between the tip and the sample does not alter the magnetic distribution of the sample. In a flux-guide SSM, the feedback coil is able to compensate the magnetization change of the flux guide according to the signal of SQUID inductively coupling with the flux guide. The attractive interaction between the flux guide and the sample is thus eliminated. Through the magnetically adjustable probe in this invention, an SPM can exert either an attractive or repulsive force on the magnetic objects of sample. Therefore, this SPM is capable of manipulating magnetic objects on the sample surface.

A more complete understanding of these and other features and advantages of the present invention will become apparent from a careful consideration of the following detailed description of certain embodiments illustrated in the accompanying drawings.

DETAILED DESCRIPTION OF THE PREFERRED EMBODIMENTS

Figure 1:
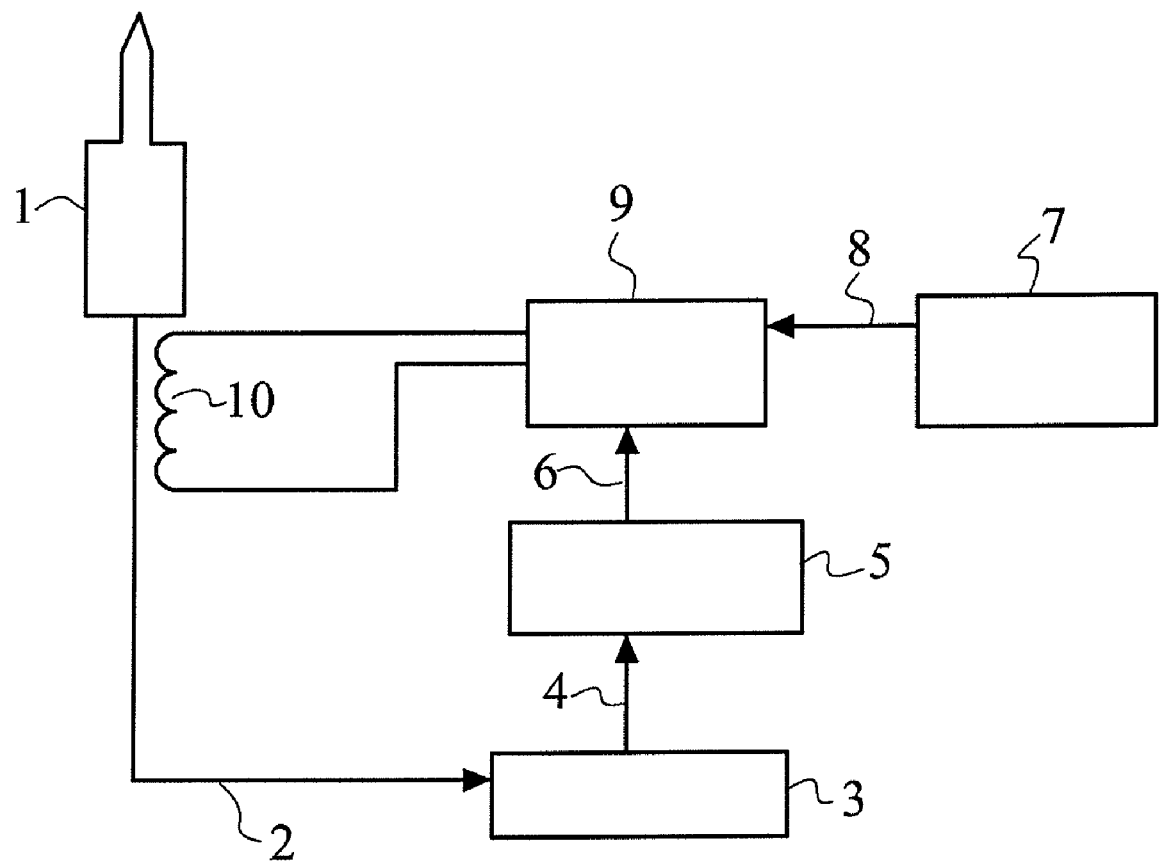
FIG. 1 is a view showing the embodiment of present invention.

FIG. 1 schematically illustrates the embodiment of the present invention. The apparatus with the capability of adjusting and controlling the magnetic state of a probe includes a probe 1 for detecting magnetic signals of a sample, a magnetic sensitive device 3 for measuring magnetic signals from said magnetic probe, a negative feedback electronic unit 5 for generating feedback signals to counter changes of the input signal from said magnetic sensitive device, a current source 9 for biasing currents, and a current bias as the controller for inputting bias signals to said current source. Wherein, the probe 1 is connected to the magnetic sensitive device 3 by a connection element 2, the output of the magnetic sensitive device 3 is connected to the input of the negative feedback electronic unit 5, between the negative feedback electronic unit 5 and the current source 9 is a feedback signal line 6, the current bias controller 7 is connected to the current source 9 by a bias signal line 8, and a feedback coil 10 is installed between the magnetic probe 1 and the current source 9 for inductively coupling with said magnetic probe 1 for inducing magnetizations in said magnetic probe through applied currents from said current source 9. A high-permeability magnetic material is used for fabricating the magnetic probe 1. The preferred material is permalloy or p-metal that are the alloy of Nicole, Iron and some other transition metals. Their bulk permeability has a typical value larger than $10^4$, which can magnify the magnetic signal. Local magnetic signals of a sample, such as the magnetic field, the magnetic flux and the magnetic force, are input from the probe to the magnetic sensitive device 3 through the connection element 2. The connection element 2 is preferably an inductive coupling element and represents an inductive coupling between the probe 1 and the magnetic sensitive device 3. After the measurement of the magnetic sensitive device 3, the magnetic signals of measurement are sent to the negative feedback electronic unit 5 through the magnetic signal line 4. According to the magnetic signal, the negative feedback electronic unit 5 generates a feedback signal to compensate the variation of magnetization of the magnetic probe 1 and then input the feedback signal into the current source 9 via the feedback signal line 6. The feedback signal determines the output current of the current source 9 that applies to the feedback coil 10. There exists an inductive coupling between the magnetic probe 1 and the feedback coil 10, and thus the coil 10 can produce a magnetic field to counter the change of magnetic state of the magnetic probe 1. The whole loop, starting from the probe to the feedback coil and back to the probe, forms a negative feedback loop for keeping the magnetic state of the probe stable. On the other hand, the probe 1 can be biased to an arbitrary magnetic state by sending a bias signal via the bias signal line 8 from the current bias controller 7 before the negative feedback loop is turned on. And, the bias current is applied to the feedback coil 10 by the current source 9. Therefore, the magnetic state of the probe can be controlled and adjusted on demand by the scheme of the present invention. In addition, the application of diminishing cycles of AC currents controlled by the current bias controller can reduce the remanence of the probe to a minimum value. The present invention is capable to be used in a situation that requires the control of magnetic state of a magnetic probe.

EXAMPLE 1

One specific application of this invention is to improve the performance of a flux-guide SSM. In a flux-guide SSM, the magnetic probe 1 is the flux guide to transfer the magnetic flux from sample to the SQUID chip inductively coupled to the probe. The magnetic sensitive device SQUID measures the magnetization variation of the probe resulting from the local magnetic field of sample. Based on the magnetic signal input from the SQUID chip, the negative feedback electronic unit sent a feedback signal to the current source. The feedback coil thus produces a magnetic field to compensate the change of the magnetization of the probe through the application of current determined by the feedback signal. To bias the magnetization of the flux guide to a certain state, the current bias controller inputs the bias signal to the current source to apply a bias current into the feedback coil before the feedback loop is on. Therefore the flux-guide SSM with the application of this invention is capable to reduce the disturbance from the magnetic probe to the sample and to manipulate magnetic force over the sample.

EXAMPLE 2

Another application of this invention is to control the magnetic tip of MFM. The magnetic probe 1 functions as the magnetic tip of MFM, which is placed on a cantilever. Behind the probe, there are two coils fabricated on the other side of the cantilever. One coil is the feedback coil of the present invention. The other one being a pick-up coil represents the connection 2 that is the inductive coupling between the probe and the magnetic sensitive device. Since the tip of MFM needs a certain magnetization to detect the magnetic force, the current bias controller works to bias a current into the feedback coil before turning on the feedback loop. The variation of magnetization of the probe is measured by the magnetic sensitive device through the pick-up coil coupled to the probe. According to the magnetic signal sent from the magnetic sensitive device, the negative feedback electronic unit controls the current source to apply the feedback current into the feedback coil to generate a magnetization that counters the change of the magnetic state of the probe. Therefore the magnetic tip of MFM with the application of this invention can be adjusted to an arbitrary magnetic state and its magnetic state can be kept stable.

As the present invention has been shown and described with reference to preferred embodiments thereof, those skilled in the art will recognize that the above and other changes may be made therein without departing from the spirit and scope of this invention.

What is claimed is:

1. An apparatus for controlling and adjusting the magnetic state of a magnetic probe, comprising:
    a magnetic probe for detecting magnetic signals of a sample;
    a magnetic sensitive device for measuring magnetic signals from said magnetic probe via an inductive coupling between said device and said magnetic probe;
    a negative feedback electronic unit for generating feedback signals to counter changes of the input signal from said magnetic sensitive device;
    a current source for biasing currents;
    a feedback coil inductively coupled with said probe, which can induce magnetizations in said magnetic probe through applied currents from said current source; and
    a current bias controller for inputting bias signals to said current source.

2. The apparatus as claimed in claim 1, wherein at least the tip of said magnetic probe is made of high-permeability material.

3. The apparatus as claimed in claim 1, wherein at least the tip of said magnetic probe is made of soft ferromagnetic material.

4. The apparatus as claimed in claim 1, wherein said feedback coil is directly wound onto said magnetic probe.

5. The apparatus as claimed in claim 1, wherein the output of said magnetic sensitive device is connected to the input of said negative feedback electronic unit.

6. The apparatus as claimed in claim 1, wherein a feedback signal line is connected between said negative feedback electronic unit and said current source.

7. The apparatus as claimed in claim 1, wherein said current bias controller is connected to said current source by a bias signal line.

8. An apparatus for reducing the magnetic interaction between the magnetic flux guide of a flux-guide scanning SQUID microscope and for adjusting the magnetic state of said magnetic flux guide, comprising:
    a magnetic flux guide for detecting magnetic signals of a sample;
    a SQUID chip as the magnetic sensitive device for measuring magnetic signals from said magnetic flux guide via an inductive coupling between said SQUID chip and said magnetic flux guide;
    a negative feedback electronic unit for generating feedback signals to counter changes of the input signal from said SQUID chip;
    a current source for biasing currents;
    a feedback coil inductively coupled with said flux guide, which can induce magnetizations in said flux guide through applied currents from said current source; and
    a current bias controller for inputting bias signals to said current source.

9. The apparatus as claimed in claim 8, wherein said flux guide is made of high-permeability material.

10. The apparatus as claimed in claim 8, wherein said flux guide is made of soft ferromagnetic material.

11. The apparatus as claimed in claim 8, wherein said inductive coupling between said SQUID chip and said flux guide is made of a direct winding coil onto said flux guide connecting to said SQUID chip.

12. The apparatus as claimed in claim 8, wherein said feedback coil is directly wound onto said magnetic flux guide.

13. The apparatus as claimed in claim 11, wherein said coil is made of superconductor material.

14. An apparatus for controlling and adjusting the magnetic state of magnetic tip of a magnetic force microscope, comprising:
    a magnetic tip for detecting magnetic signals of a sample;
    a magnetic sensitive device for measuring magnetic signals from said magnetic tip via an inductive coupling between said device and said magnetic tip;
    a negative feedback electronic unit for generating feedback signals to counter changes of the input signal from said magnetic sensitive device;
    a current source for biasing currents;
    a feedback coil inductively coupled with said magnetic tip, which can induce magnetizations in said magnetic tip through applied currents from said current source; and
    a current bias controller for inputting bias signals to said current source.

15. The apparatus as claimed in claim 14, wherein said magnetic tip is made of high-permeability material.

16. The apparatus as claimed in claim 14, wherein said magnetic tip is made of soft ferromagnetic material.

* * * * *